United States Patent [19]

Hanato et al.

[11] Patent Number: 5,414,220
[45] Date of Patent: May 9, 1995

[54] FLEXIBLE WIRING CABLE

[75] Inventors: Yoshio Hanato; Toshio Hori; Hiromichi Tokuda; Toshimi Kaneko, all of Nagaokakyo, Japan

[73] Assignee: Murata Manufacturing Co., Ltd., Nagaokakyo, Japan

[21] Appl. No.: 139,543

[22] Filed: Oct. 19, 1993

[30] Foreign Application Priority Data

Oct. 19, 1992 [JP] Japan .................................. 4-279839

[51] Int. Cl.6 ............................................. H05K 1/00
[52] U.S. Cl. ..................................... 174/254; 174/255; 361/749; 361/750; 361/776; 361/794; 439/67; 439/77
[58] Field of Search ....................... 174/254, 251, 255; 361/749, 750, 784, 794, 799, 776; 439/67, 74, 77, 83

[56] References Cited

U.S. PATENT DOCUMENTS 4,026,011  5/1977  Walton ................................ 361/749
5,093,761  3/1992  Ozaki ................................. 361/749

Primary Examiner—Leo P. Picard
Assistant Examiner—Cheryl R. Figlin
Attorney, Agent, or Firm—Ostrolenk, Faber, Gerb & Soffen

[57] ABSTRACT

Disclosed herein is a flexible wiring cable being provided on its forward end with a connecting portion to be connected with a connector, which comprises a base film, a wiring conductor provided on the base film, a dielectric member electrically connected with the wiring conductor in the connecting portion of the base film, and a ground electrode electrically connected with the dielectric member for forming a capacitor with the wiring conductor.

7 Claims, 4 Drawing Sheets

FLEXIBLE WIRING CABLE

BACKGROUND OF THE INVENTION

1. Field of the Invention

The present invention relates to a flexible wiring cable comprising a plurality of wiring conductors which are provided on a flexible base film.

2. Description of the Background Art

In an electronic device such as an office automation product, a flexible wiring cable is generally applied to an interface provided in its interior or between such devices. When an electric signal flows to such a flexible wiring cable, electromagnetic interference noise may be radiated from the wiring conductor part toward its periphery, to cause electromagnetic trouble in another peripheral electronic device or cable. In order to eliminate such electromagnetic interference noise (EMI noise), generally employed is a method of providing a filter element around a connector which is connected with the flexible wiring cable, or a method of passing the flexible wiring cable through a core which is made of a magnetic material such as ferrite.

However, the method of providing a filter element requires extra space for mounting such a filter element and an operation for mounting the filter element and electrically mounting the same, as well as an additional cost for such mounting. On the other hand, the method of mounting a ferrite core requires an operation for fixing the ferrite core after the aforementioned passage in addition to an operation for mounting the ferrite core, leading to increase in cost.

SUMMARY OF THE INVENTION

An object of the present invention is to solve the aforementioned problems of the prior art and provide a flexible wiring cable which can eliminate noise with no requirement for an extra space and a specific mounting operation for noise elimination.

A flexible wiring cable according to the present invention, which is provided on its forward end portion with a connecting portion to be connected with a connector, comprises a base film, a wiring conductor which is provided on the base film, and a ground electrode which is provided on the connecting portion of the base film through the base film for forming a capacitor with the wiring conductor.

While a capacitor is formed by the wiring conductor and the ground electrode according to the present invention, an independent dielectric member may be provided on the connecting portion for forming such a capacitor, or the base film itself may be held by the wiring conductor and the ground electrode to serve as a dielectric member for forming the capacitor.

When an independent dielectric member is provided on the connecting portion, this dielectric member may be employed as a reinforcing plate for improving strength in the connecting portion.

According to the present invention, the dielectric member is not particularly restricted but can be formed by a ceramic plate or a resin ceramic dielectric member containing dielectric powder, for example.

According to the present invention, the wiring conductor provided on the connecting portion is employed to form a capacitor with the ground electrode, thereby forming a filter element on the connecting portion of the flexible wiring cable. Thus, neither an extra space nor an additional operation is required for providing a filter element or passing the cable through a ferrite core, dissimilarly to the prior art.

According to the present invention, the connecting portion is provided with a capacitor which is formed by the wiring conductor and the ground electrode through the base film. Therefore, it is not necessary to provide an independent filter element around a connector and to mount a ferrite core on the cable, dissimilarly to the prior art. Thus, no extra space is required for an independent filter or a ferrite core, while no operation is required for mounting such an element. Therefore, it is possible to mount the inventive flexible wiring cable in higher density, as well as to contribute to reduction in manufacturing cost for an electronic device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
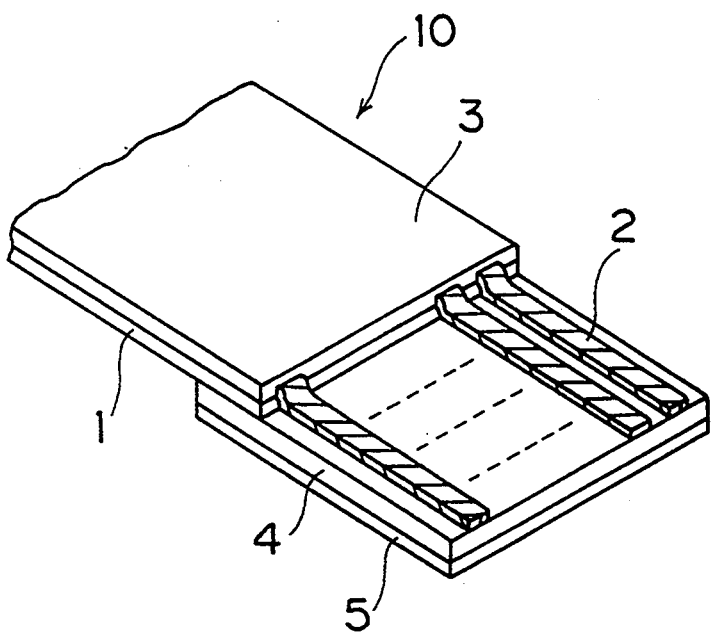
FIG. 1 is a perspective view showing a connecting portion of a flexible wiring cable according to a first embodiment of the present invention.

FIG. 1 is a perspective view showing a connecting portion of a flexible wiring cable 10 according to a first embodiment of the present invention. Referring to FIG. 1, a plurality of wiring conductors 2 are provided on a base film 1 at prescribed intervals along the longitudinal direction. The base film 1 is formed by a film having flexibility, which is made of insulating resin such as polyimide or polyester, for example. The wiring conductors 2 can be properly formed by a method of sticking a metal sheet on the base film 1 and thereafter etching the same, a plating method, or a method of applying conductive paste and hardening the same.

In the connecting portion of the flexible wiring cable 10 according to this embodiment, the wiring conductors 2 are protrudingly exposed from the base film 1 and an overlay 3, and a reinforcing plate 4 is provided under the wiring conductors 2. This reinforcing plate 4 is prepared from a dielectric material such as resin ceramic which is made of resin such as polyester containing dielectric powder of barium titanate or the like, for example.

Figure 2:
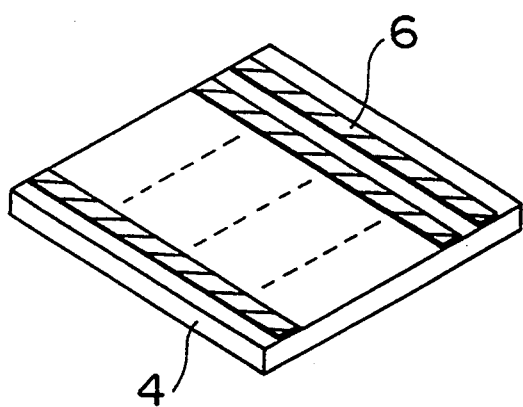
FIG. 2 is a perspective view showing a front side of a reinforcing plate which is employed in the embodiment shown in FIG. 1.

FIG. 2 shows a surface of the reinforcing plate 4 closer to the wiring conductors 2, which is provided with electrodes 6 in the same pattern as the wiring conductors 2.

Figure 3:
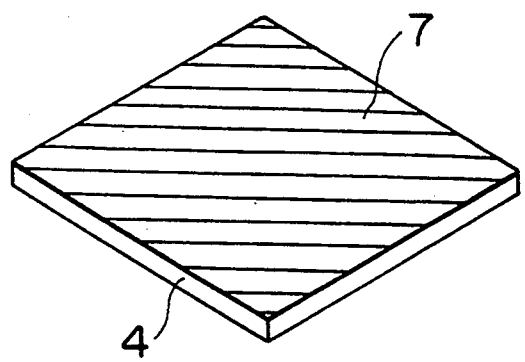
FIG. 3 is a perspective view showing a back side of the reinforcing plate which is employed in the embodiment shown in FIG. 1.

FIG. 3 shows a back surface of the reinforcing plate 4, which is entirely provided with a ground electrode 7. Referring to FIG. 1, a metal plate 5 on the back surface of the reinforcing plate 4 is provided with such a ground electrode 7. The wiring conductors 2 and the reinforcing plate 4 as well as the reinforcing plate 4 and the metal plate 5 can be connected with each other by soldering, or with a conductive adhesive.

Figure 4:
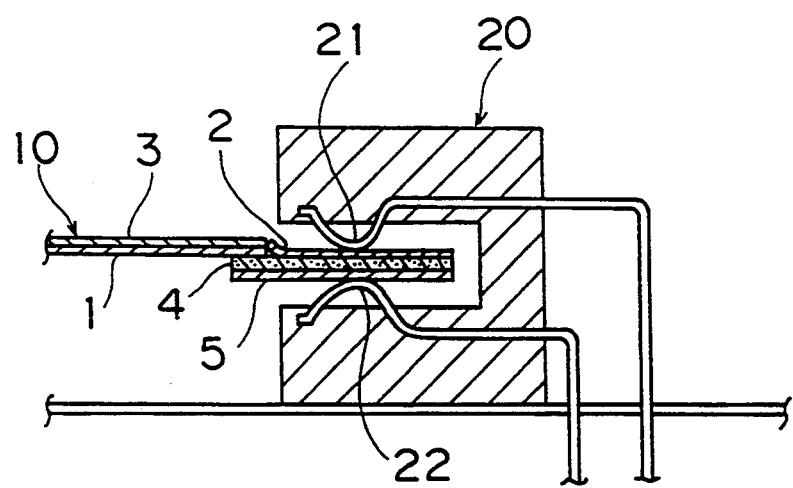
FIG. 4 is a sectional view showing the connecting portion of the flexible wiring cable according to the embodiment shown in FIG. 1, which is connected to a connector.

FIG. 4 is a sectional view showing the connecting portion of the flexible wiring cable 10 according to the embodiment shown in FIG. 1, which is inserted in and connected to a connector 20. Referring to FIG. 4, the connecting portion of the flexible wiring cable 10 is inserted in a cable inlet of the connector 20, so that the wiring conductors 2 are electrically connected with a contact terminal 21 and the metal plate 5 is electrically connected with a ground terminal 22. The electrodes 6 provided on the surface of the reinforcing plate 4 shown in FIG. 2 are electrically connected with the wiring conductors 2, while the ground electrode 7 provided on the other surface of the reinforcing plate 4 shown in FIG. 3 is electrically connected with the metal plate 5. Thus; the wiring conductors 2 and the metal plate 5 hold the reinforcing plate 4, which is a dielectric member, to form capacitors.

Figure 5:
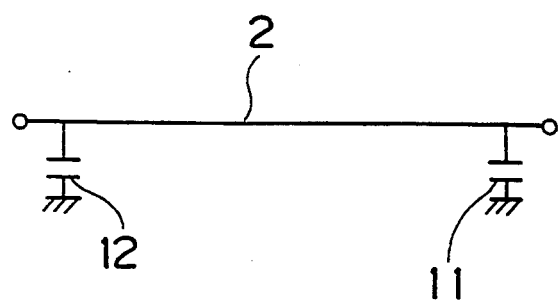
FIG. 5 is an equivalent circuit diagram of each wiring conductor of the flexible wiring cable which has the connecting portion shown in FIG. 1 on each end.

When such capacitors are formed on the connecting portion provided on each end of the flexible wiring cable 10, for example, it is possible to form capacitors 11 and 12 on both ends of each wiring conductor 2, as shown in FIG. 5. Thus, it is possible to eliminate noise with provision of neither an independent filter element nor a ferrite core. In the first embodiment of the present invention shown in FIGS. 1 to 4, it is not requisite to provide the metal plate 5, but the ground electrode 7 may be directly connected with the terminal 22 of the connector 20. Further, the ground electrode 7 may be formed in the same pattern as the electrodes 6 provided on the front surface, to eliminate difference between the front and back surfaces.

Figure 6:
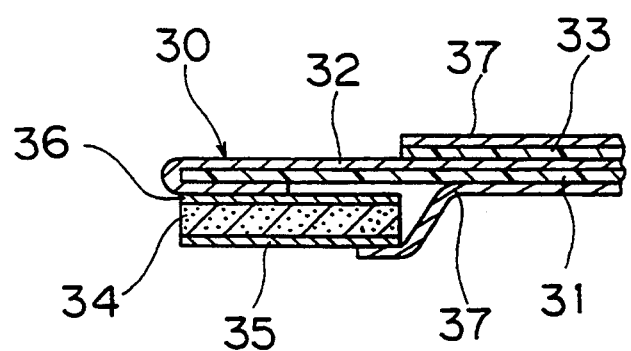
FIG. 6 is a sectional view showing a connecting portion of a flexible wiring cable according to a second embodiment of the present invention.

FIG. 6 is a sectional view showing a connecting portion of a flexible wiring cable 30 according to a second embodiment of the present invention. Referring to FIG. 6, the flexible wiring cable 30 comprises wiring conductors 32 which are formed on a base film 31 in a similar manner to the aforementioned embodiment, while an overlay 33 covers upper portions of the wiring conductors 32. Further, this flexible wiring cable 30 is entirely covered with a shield 37 of metal foil such as copper foil or aluminum foil, except the connecting portion provided on each end. In the connecting portion, the wiring conductors 32 provided on the base film 31 extend toward the back surface around the forward end of the base film 31. The base film 31 is provided on its back surface with a reinforcing plate 34 which is made of a dielectric material, and discrete electrodes 36 are formed on this reinforcing plate 34. Ends of the wiring conductors 32 extending toward the back surface of the base film 31 are in contact with and electrically connected to the discrete electrodes 36. Such connection can be attained by soldering, with a conductive adhesive.

A common electrode 35 is provided on a lower surface of the reinforcing plate 54 which is opposite to the surface provided with the discrete electrodes 36. A forward end of the shield 37 which is made of metal foil or the like is electrically connected to this common electrode 35.

According to this embodiment, the forward ends of the wiring conductors 32 extend toward the back surface of the base film 31 to be electrically connected with the discrete electrodes 36, which in turn are opposed to the common electrode 35 through the reinforcing plate 54 of a dielectric material, thereby forming capacitors. Further, the common electrode 35 forming such capacitors is electrically connected with the shield 37 entirely covering the flexible wiring cable 30. Thus, it is possible to further improve an effect of noise elimination.

Figure 7:
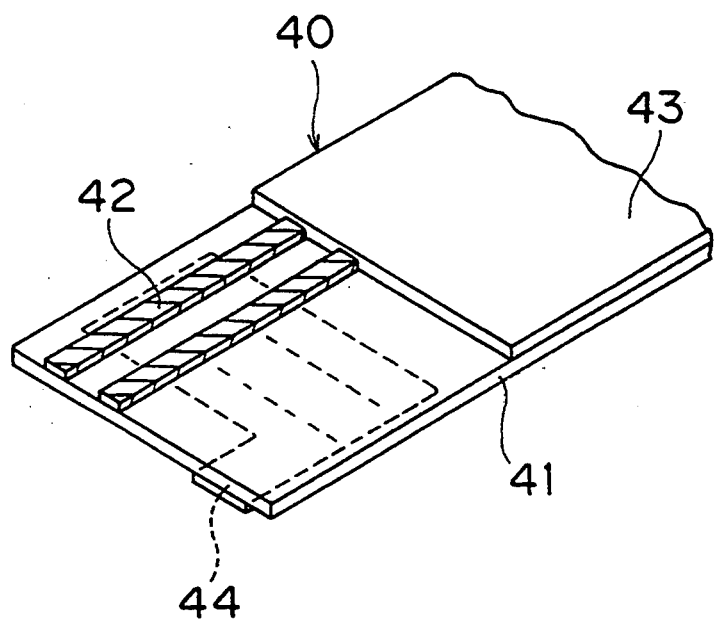
FIG. 7 is a perspective view showing a connecting portion of a flexible wiring cable according to a third embodiment of the present invention.
Figure 8:
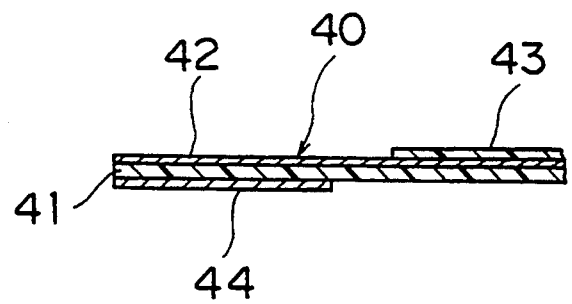
FIG. 8 is a sectional view of the connecting portion according to the third embodiment shown in FIG. 7.

FIG. 7 is a perspective view showing a connecting portion of a flexible wiring cable 40 according to a third embodiment of the present invention, and FIG. 8 is a sectional view thereof. Referring to FIGS. 7 and 8, the flexible wiring cable 40 comprises wiring conductors 42 which are formed on a base film 41, while an overlay 43 covers upper portions of the wiring conductors 42. The overlay 43 is removed from the connecting portion of the flexible wiring cable 40, to expose the wiring conductors 42. A ground electrode 44 is provided on a back surface of the base film 41 which is opposite to that provided with the wiring conductors 42. As shown in FIG. 7, the wiring conductors 42 and the ground electrode 44 are opposite to each other through the base film 41. The base film 41 is formed by an insulating film, whereby the ground electrode 44 and the wiring conductors 42 are opposed to each other through such a dielectric material, to form capacitors. According to this embodiment, the base film 41 is employed as a dielectric member to form capacitors in the connecting portion, without employing an independent dielectric member.

As hereinabove described, it is possible to effectively eliminate EMI noise by forming capacitors on each connecting portion of a flexible wiring cable, to serve as noise filter elements.

While the wiring conductors are formed on the base film in each of the aforementioned embodiments, the same may alternatively be embedded in the base film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A flexible wiring cable being provided on at least one end portion with a connecting portion to be connected with a connector, said flexible wiring cable comprising:
   a base film;
   a wiring conductor being provided on said base film;
   a dielectric member having opposed first and second surfaces and being electrically connected on said first surface with said wiring conductor, said dielectric member being located in said connecting portion; and
   a ground electrode being electrically connected witch said dielectric member on said second surface for forming a capacitor with said wiring conductor, said capacitor serving as an electromagnetic noise filter element when said connecting portion is connected to said connector.

2. A flexible wiring cable in accordance with claim 1, wherein said dielectric member is formed by a ceramic plate.

3. A flexible wiring cable in accordance with claim 1, wherein said dielectric member is made of resin containing dielectric powder.

4. A flexible wiring cable in accordance with claim 1, wherein said dielectric member is comprised of a material such that said dielectric member also serves as a reinforcing plate which is provided on said connecting portion.

5. A flexible wiring cable in accordance with claim 1, further comprising a conductive shield surrounding said wiring cable, wherein said ground electrode is electrically connected with said shield.

6. A flexible wiring cable in accordance with claim 1, wherein said dielectric member is formed by a part of said base film being made of a dielectric material and being located in said connecting portion.

7. A flexible wiring cable being provided on at least one end portion with a connecting portion to be connected with a connector, said flexible wiring cable comprising:
   a base film;
   a wiring conductor being provided on a first side of said base film; and
   a ground electrode being provided on a side of said base film opposed to said first side so as to hold a portion of said base film being made of a dielectric material and being located in said connecting portion with said wiring conductor, thereby forming a capacitor with said wiring conductor, said capacitor serving as an electromagnetic noise filter element when said connecting portion is connected to said connector.

* * * * *